United States Patent
Duvnjak

(10) Patent No.: US 8,750,002 B2
(45) Date of Patent: Jun. 10, 2014

(54) POWER LIMITING BY MODULATING CLOCK

(75) Inventor: Rajko Duvnjak, Kanata (CA)

(73) Assignee: Power Integrations, Inc., San Jose, CA (US)

(*) Notice: Subject to any disclaimer, the term of this patent is extended or adjusted under 35 U.S.C. 154(b) by 72 days.

(21) Appl. No.: 13/490,320

(22) Filed: Jun. 6, 2012

(65) Prior Publication Data

US 2013/0329462 A1  Dec. 12, 2013

(51) Int. Cl.
  *H02M 3/24* (2006.01)
  *H02M 3/335* (2006.01)

(52) U.S. Cl.
  USPC ........................... 363/95; 363/21.01

(58) Field of Classification Search
  USPC ................. 363/20, 21.01, 95, 98, 131
  See application file for complete search history.

(56) References Cited

U.S. PATENT DOCUMENTS

| | | | |
|---|---|---|---|
| 5,966,297 A * | 10/1999 | Minegishi | 363/24 |
| 6,525,514 B1 | 2/2003 | Balakrishnan et al. | |
| 7,092,265 B2 * | 8/2006 | Kernahan | 363/65 |
| 7,206,339 B2 * | 4/2007 | Uchino et al. | 375/224 |
| 7,450,633 B2 * | 11/2008 | Uchino et al. | 375/224 |
| 7,791,634 B2 * | 9/2010 | Masui et al. | 347/249 |
| 8,164,933 B2 * | 4/2012 | Fujita et al. | 363/127 |

OTHER PUBLICATIONS

"TNY274-280 TinySwitch-III Family: Energy-Efficient, Off-Line Switcher With Enhanced Flexibility and Extended Power Range," Power Integrations, Inc., Rev. 1, Jan. 2009 (24 pages).

* cited by examiner

*Primary Examiner* — Adolf Berhane
(74) *Attorney, Agent, or Firm* — Blakely Sokoloff Taylor & Zafman LLP

(57) ABSTRACT

A clock generation circuit for use in a power converter controller includes a modulation signal generator that is coupled to generate a modulation signal in response to an input sense signal representative of an input voltage of a power converter. The modulation signal is responsive to the input sense signal when the input sense signal is greater than a first input threshold. A clock modulator circuit is coupled to receive the modulation signal and a first clock signal from an oscillator. The clock modulator circuit is coupled to generate a second clock signal in response to the first clock signal and the modulation signal. An average frequency of the second clock signal is responsive to the modulation signal.

27 Claims, 11 Drawing Sheets

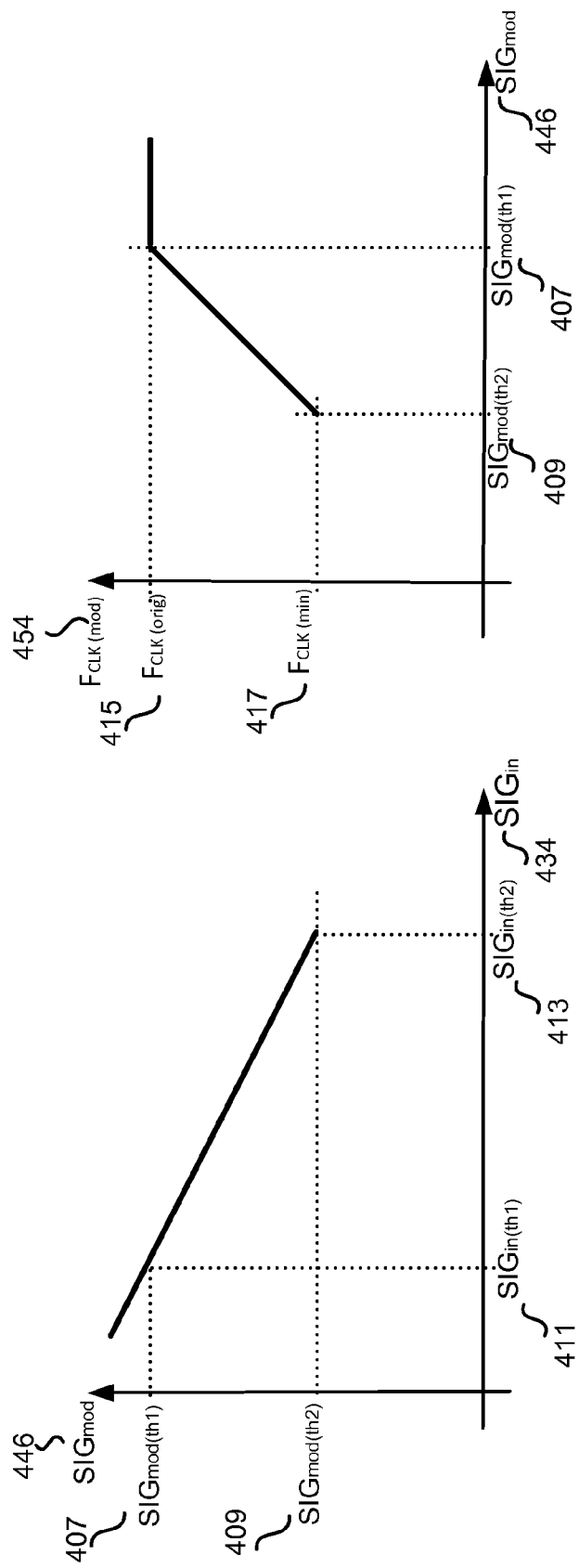

POWER LIMITING BY MODULATING CLOCK

BACKGROUND INFORMATION

1. Field of the Disclosure

The present invention relates generally to power converters. More specifically, examples of the present invention are related to limiting power delivered by a power converter.

2. Background

Many electronic devices include power supplies to provide the devices with regulated direct current (dc) power sources. Switched mode power supplies operating at high frequencies (HF) are very popular due to their small size, good output regulation, high efficiency, and safety features. Switched mode power supplies may be used to convert alternating current (ac) sources or high voltage dc sources into regulated dc sources with desired voltages at the outputs. Depending on the specific applications, different types of switched mode power supplies with different control methods and different features may be utilized.

Typically, a switched mode power supply includes a switching element or power switch controlled by a controller that is coupled to an energy transfer element, such as for example a high frequency transformer or coupled inductor, which provides safety isolation and transforms the voltage level. The output of the transformer is then rectified and filtered to provide a regulated dc output to be provided to an electronic device. The controller may be implemented in an integrated circuit (IC) and the switching element may also be monolithically or non-monolithically included in the same IC. The controller typically receives multiple input signals representative of various parameters of the switch mode power supply. The controller processes the sensed signals and generates control signals to control switching of the power switch between an on state and an off state to regulate the amount of power transferred across the energy transfer element to a load to regulate the output of the power supply in a closed loop.

The output regulation of the power supply is through processing the feedback from the output. The feedback signal from the output can come through an optocoupler from a sense circuit coupled to the dc output. When the feedback is referenced to the secondary ground, it is referred as the secondary control. In some switch mode power supplies, the output sense may be extracted indirectly from a third winding that is magnetically coupled to the secondary winding on the same transformer core. In this example, the feedback signal may be referenced to the primary ground, and is therefore referred to as primary control. The third winding may also provide operating power for controller and is sometimes referred to as a bias or feedback winding. The feedback signal may then be used by the controller to, for example, modulate the pulse width (i.e., PWM), change switching frequency (i.e., PFM), or enable and disable the power switch in some cycle intervals, which is referred as on-off control resulting in controlled pulse skipping in the drive signal used to control switching of the switch.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4A is a graph illustrating a relationship between an example modulation signal with respect to an input voltage of an example power converter in accordance with the teachings of the present invention.

FIG. 4B is a graph illustrating a relationship between an average frequency of a modulated clock signal output by an example clock generation circuit with respect to an example modulation signal in an example power converter in accordance with the teachings of the present invention.

Figure 1:
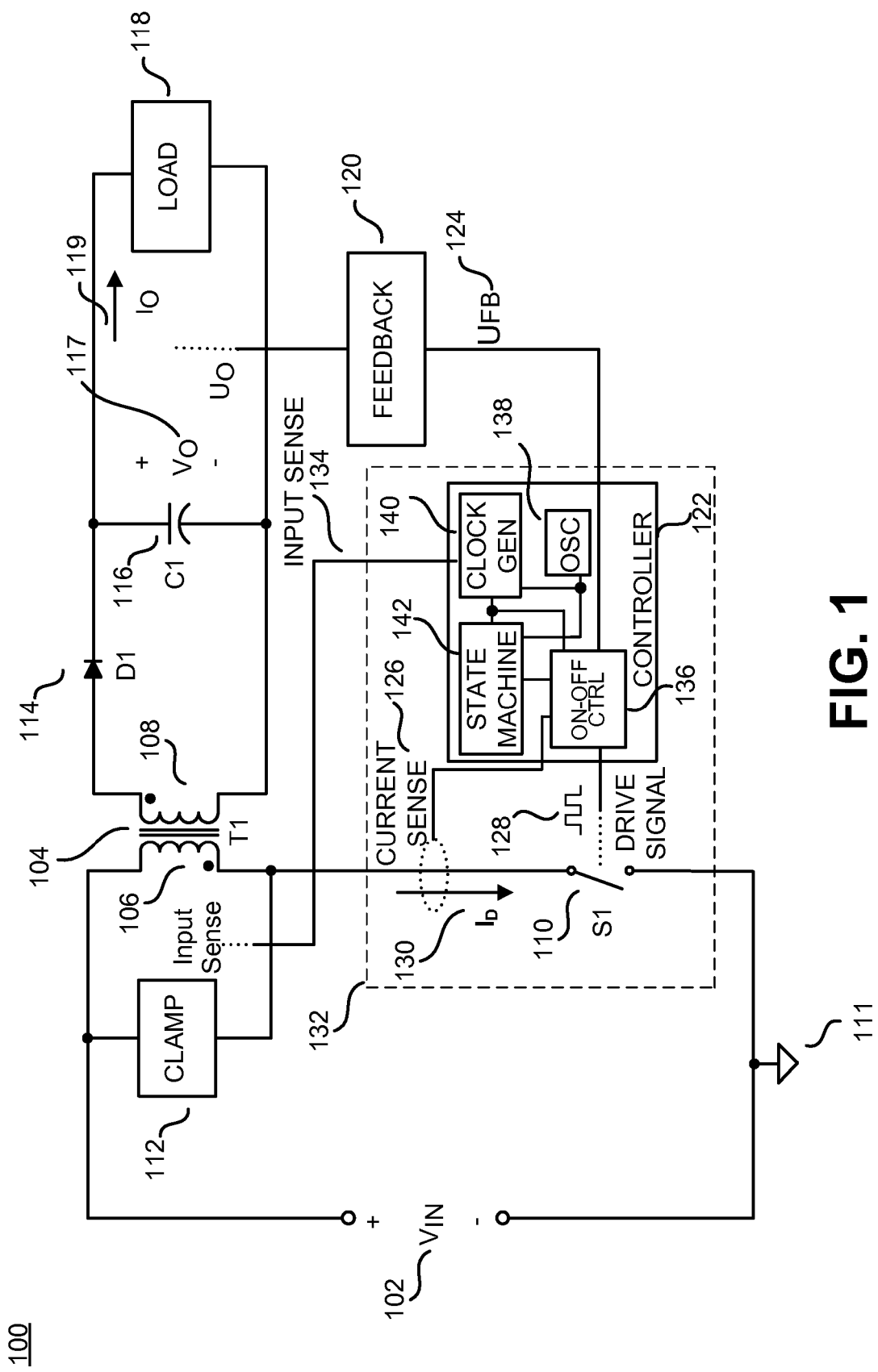
FIG. 1 is a block diagram illustrating one example of a power converter having a controller including an example clock generation circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention provide power converter controllers that reduce the average switching frequency of on-off controllers as the line input voltages of the power converters increase. As will be described, by reducing the average switching frequency as the input voltage increases, the maximum power that is delivered to the output of the power converter is limited to remain within the maximum power rating of the power converter in accordance with the teachings of the present invention. As a result, an example power converter in accordance with the teachings of the present invention includes an input that may operate over a wide range of input voltages with a reduced risk of the output of the power converter exceeding the maximum power rating of the power converter.

Controllers that employ on-off control often control a current that flows through the power switch with respect to a current limit threshold, which is referred as current mode control. Current mode control may utilize a fixed switching frequency. In current mode control schemes, the on-time of each pulse of the drive signal is terminated when the current flowing in the power switch reaches the current limit threshold of the pulse peak value. In this control method, power switch current ramps up linearly when the power switch is on until the power switch current reaches the current limit threshold and power switch is then turned off. The current limit threshold can be varied for different conditions of load and input voltage to improve regulation of the output. The feedback may be used to decide the enabling and disabling intervals/periods of switching (pulse skipping scheme, commanded by enabling signal or disabling signal through a state machine).

For example, when the enabling signal is below a regulation threshold, the power switch is switched at constant frequency. However, when the feedback signal is above the regulation threshold, the switching regulator is disabled resulting in a skipped cycle of a power switch. When cycles are skipped by the switching regulator as described above, the resulting average frequency of operation of the switching regulator is reduced. Thus the frequency of operation of the switching regulator is varied as cycles are skipped at different modes of pulse skipping to regulate the DC output of the power converter, with the frequency of operation decreasing as the load coupled to the output decreases.

Generally, when the frequency of operation of known power supplies of this type drop to frequencies within the audio range, such as within 20 Hz to 20 KHz, undesirable audio noise is generated by the transformers of the power supplies. One example of a switching regulator includes a state machine, with each state representing a current limit. At full load, the current limit is at the full level. As the load decreases, the frequency decreases until it is approximately 20 KHz, the upper level of the audible range. At this point, a state transition to one with lower current limit is executed. (For example, if the clock frequency of the oscillator is 120 KHz and the control circuitry detects 6 skipped cycles, the control circuitry will cause the state transition to one with lower current limit). In order to provide the same power on the output, the feedback loop will request more switching cycles, thus increasing the frequency of operation. Therefore the frequency is maintained above the audio frequency range at this point.

In one example, this process is repeated as the load is reduced until the state with lowest current limit has been reached. This state has the current limit level that is low enough such that the flux density through the power converter transformer does not cause the transformer to produce unacceptable levels of audio noise. Therefore, the flux density through the transformer is limited to low values with the selected low current limit levels when the switching regulator operates within the audible frequency range due to the light loads.

In various example controllers in accordance with the teachings of the present invention, a state machine employing a plurality of current limits is utilized. For instance, a power converter including the example controller may be operating with the state machine setting the current limit to a current limit level lower than the maximum current limit level, and with the feedback circuitry requiring that the power switch in the power converter be turned-on for N consecutive cycles. When the load of the power converter increases, the state machine then transitions to higher current limit level. For example, if the power switch is turned on during 6 consecutive clock cycles, the state machine will increase the current limit level to transfer additional power to the load.

The primary current ramp of the power converter is proportional to the input voltage. In on-off control schemes, when the power converter operates with high input voltage, the slope of converter current ramp could be much faster when compared with the slope of the converter current ramp with low input voltage (i.e., Vin=Ldi/dt). Due to the delay inside the controller (e.g., propagation delay and reaction/response delay), a fast rise of the current pulse through the power switch may cause an actual turn off current (i.e., the peak current) in the inductor that overshoots the desired peak value, which has the undesired consequence of the output of the power converter exceeding the nominal power rating of the converter. Flyback converters employing on-off controllers are frequently utilized in applications with low to medium power ranges. Thus, when operating with high input voltages, flyback converters may exceed the maximum power limit due to such delays inside the controllers. The higher the input voltages, the more serious this issue becomes.

One possible way to limit the power on the output of the power converter with increased input voltage is to reduce the clock frequency. However, by simply reducing the clock frequency there is a risk that the power converter will operate with the switching frequency in the audio range. For example, if the control circuitry is implemented such that it changes the state of the state machine when, for example, 6 cycles are skipped and the clock frequency is reduced below 120 KHz (to limit the power), the converter can operate with the frequency in the audio range.

In an example power converter in accordance with the teachings of the present invention, two clock frequencies are generated. The original (fixed) frequency is used to control the state machine when it reduces the current limit levels by monitoring the number of skipped cycles and thus prevents the power converter from operating in the audio range when the flux through power converter transformer is high. The other clock signal (modulated clock signal) is generated from the original clock signal and the frequency of this clock signal is reduced in response to the signal proportional to the input voltage.

The modulated clock signal is used to control the power switch and therefore limit the maximum power that the power converter can provide in the response to the input voltage. The modulated clock signal is also used by the state machine to determine when the state machine increases the current limit level. For example, if the power supply operates with low or moderate load and the feedback signal requires that the power switch is turned on for N consecutive cycles of modulated clock signal, the state machine will increase the current limit level.

To illustrate, FIG. 1 is a block diagram illustrating one example of a power converter 100 having a controller 122 including an example clock generation circuit 140 in accordance with the teachings of the present invention. As shown in the depicted example, power converter 100 includes an energy transfer element 104 having a first winding 106 and a second winding 108 coupled between an input and an output of power converter 100. In the illustrated example, first winding 106 is a primary winding and second winding 108 is a secondary winding. As shown in FIG. 1, the input of power converter 100 is coupled to receive an input voltage $V_{IN}$ 102 and a load 118 is coupled to the output of the of power converter 100 to receive an output voltage $V_O$ and an output current $I_O$. A clamp 112 is coupled across first winding 106 and a rectifier diode 114 and output capacitor C1 116 are coupled to second winding 108 as shown.

As shown in the example, a power switch S1 110 is coupled between first winding 106 of energy transfer element 104 and a reference terminal 111. A controller 122 is coupled to control switching of power switch S1 110 with a drive signal 128 to control a transfer of energy from the input of power converter 100 to the output of power converter 100 through energy transfer element 104 in response to a feedback signal $U_{FB}$ 124. In one example, feedback signal $U_{FB}$ 124 is received from a feedback circuit 120 and is representative of an output quantity $U_O$ at the output of power converter 100. In one example, output quantity $U_O$ may be representative of output voltage $V_O$, output current $I_O$, or a combination thereof. In one example, controller 122 and power switch S1 110 are included in an integrated circuit 132. In one example, integrated circuit 132 may be monolithic integrated circuit or a hybrid integrated circuit. In another example, controller 122 and power switch S1 110 are separate discreet parts.

As shown in the example depicted in FIG. 1, controller 122 includes an on-off control circuit 136 coupled to generate drive signal 128, which is coupled to control the switching of power switch S1 110. In the example, drive signal 128 is coupled to be generated in response to feedback signal $U_{FB}$ 124, which is representative of the output of power converter 100. In one example, on-off control circuit 136 is further coupled to receive a current sense signal 126, which is representative of a current $I_D$ 130 through power switch S1 110. In one example, on-off control circuit is further coupled to receive a current limit signal from state machine 142, and drive signal 128 is further coupled to be generated in response current sense signal 126 and the current limit signal provided from state machine 142.

In one example, state machine 142 is coupled to increase the current limit provided to on-off control circuit 136, up to a maximum current limit, to regulate the output power converter 100 in response to one or more consecutive enabled cycles in drive signal 128, which indicate an increasing load 118 coupled to the output of power converter 100. Similarly, in one example, state machine 142 is coupled to decrease the current limit provided to on-off control circuit 136, down to a minimum current limit, to regulate the output power converter 100 in response to one or more consecutive disabled cycles in drive signal 128, which indicate a decreasing load 118 coupled to the output of power converter 100.

In the illustrated example, controller 122 also includes an oscillator 138 that is coupled to generate a first clock signal, which may also sometimes be referred to in this disclosure as an original clock signal. In one example, the first clock signal that is generated by oscillator 138 is coupled to be received by state machine 142 and a clock generation circuit 140 in accordance with the teachings of the present invention. In one example, and as will be discussed in further detail below, clock generation circuit 140 is coupled to generate a second clock signal, which is also sometimes referred to in this disclosure as a modulated clock signal. In one example, the second clock signal that is generated by clock generation circuit 140 is coupled to be received by state machine 142 and on-off control circuit 136 in accordance with the teachings of the present invention. As will be discussed, in one example, a modulation signal is generated within clock generation circuit 140 in response to the first clock signal received from oscillator 138 and an input sense signal 134 that is representative of input voltage $V_{IN}$ 102 in accordance with the teachings of the present invention. In one example, input sense signal 134 is representative of an input line voltage providing input voltage $V_{IN}$ 102 to power converter 100.

Figure 2:
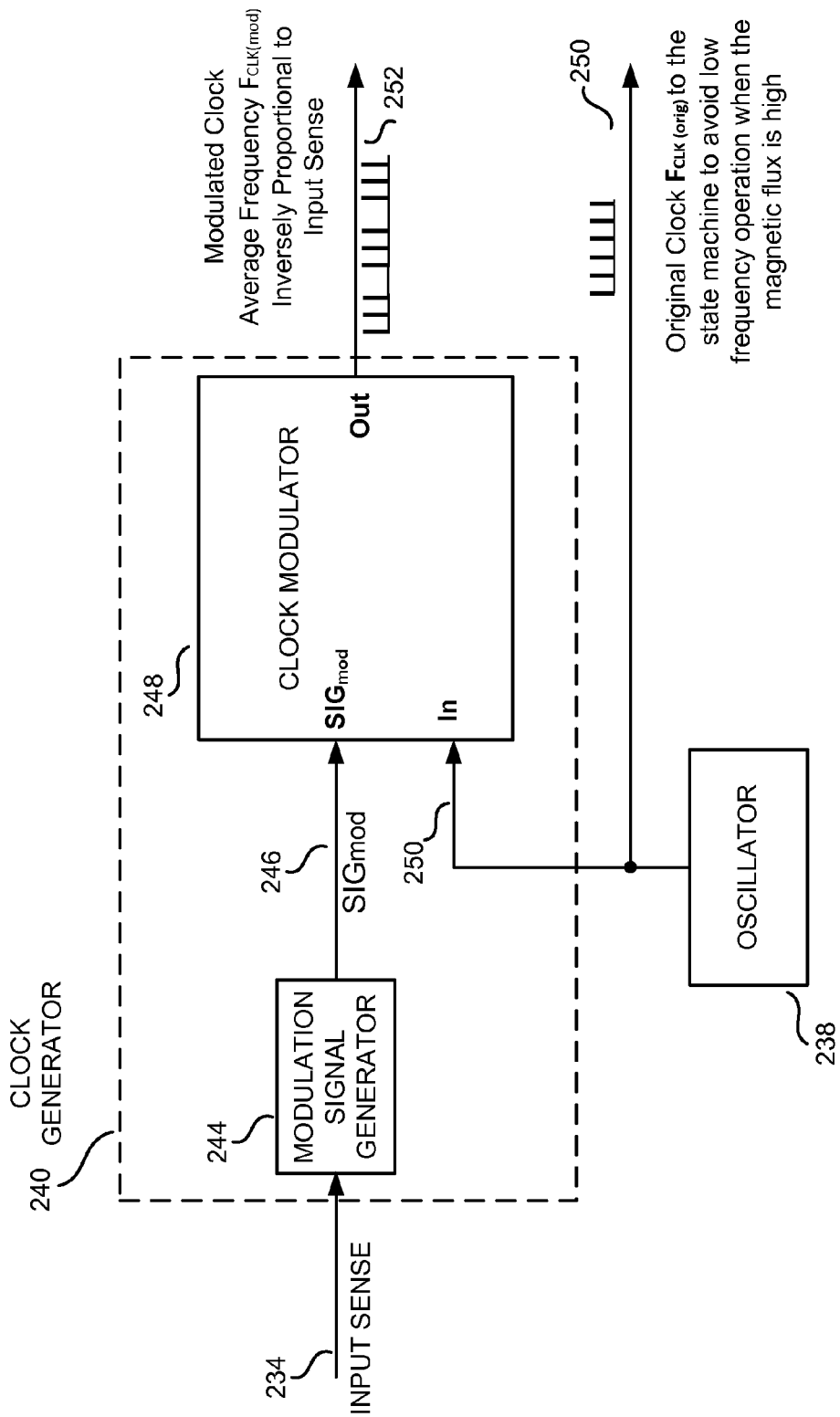
FIG. 2 is a block diagram illustrating one example of a clock generation circuit in accordance with the teachings of the present invention.

FIG. 2 is a block diagram illustrating further detail of one example of a clock generation circuit 240 in accordance with the teachings of the present invention. In one example, clock generation circuit 240 of FIG. 2 corresponds with clock generation circuit 140 included in controller 122 of FIG. 1. As shown in the example depicted in FIG. 2, clock generation circuit 240 includes a modulation signal generator 244 that is coupled to generate a modulation signal 246 in response to an input sense signal 234. In the example depicted in FIG. 2, input sense signal 234 corresponds with input sense signal 134 of FIG. 1, and is therefore representative of an input voltage $V_{IN}$ 102 of power converter 100. As will be discussed in further detail below, in one example, the magnitude of modulation signal 246 is inversely proportional to input sense signal 234 when input sense signal 234 is greater than a first input threshold $V_{in(th1)}$.

As illustrated in the depicted example, clock generation circuit 240 also includes a clock modulator circuit 248 that is coupled to receive modulation signal 246 and a first clock signal 250 from an oscillator 238. In one example, oscillator 238 of FIG. 2 corresponds with oscillator 138 of FIG. 1. As shown in the example of FIG. 2, clock modulator circuit 248 is coupled to generate second clock signal 252 in response to first clock signal 250 and modulation signal 246. In one example, an average frequency of second clock signal 252 is proportional to modulation signal 246, which is inversely proportional to input sense signal 234, and therefore inversely proportional to input voltage $V_{IN}$ 102 of the power converter, when input sense signal 234 is greater than a first input threshold $V_{in(th1)}$.

In one example, first clock signal 250 may be used to control state machine 142 when cycles of drive signal 128 are disabled by on-off control circuit 136 to control the decrease of the current limit signal provided by state machine 142 to on-off control circuit 136. In one example, second clock signal 252 may be used to control on-off control circuit 136 and state machine 142 when cycles of drive signal 128 are enabled by on-off control circuit 136 to control the increase of the current limit signal provided by state machine 142 to on-off control circuit 136.

Figure 3:
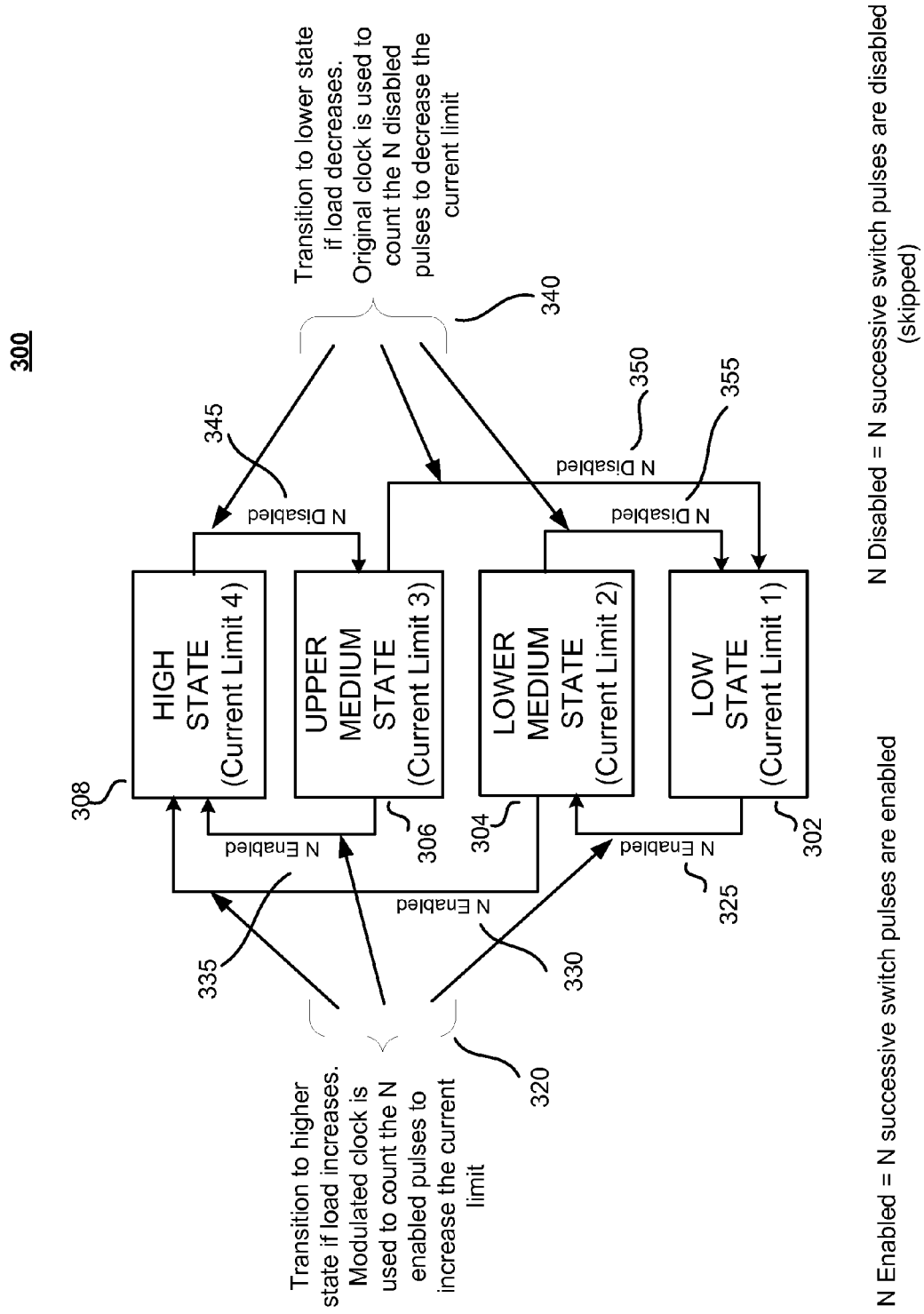
FIG. 3 is an example block diagram of a state machine in accordance with the teachings of the present invention.

To illustrate, FIG. 3 shows one example of a functional block diagram of a state machine 300 that transitions between four operating states by counting N consecutive enabled clock pulses or N consecutive disabled clock pulses as shown. As shown in the depicted example, state machine 300 includes a low state operating state 302, which has the lowest current limit of current limit 1. After counting N enabled consecutive clock pulses 325 of switching, state machine 300 transitions to a lower medium state 304, which has a higher current limit of current limit 2. If another N enabled consecutive clock pulses 330 are counted while state machine 300 is operating in lower medium state 304, state machine 300 transitions to high state 308, which has the highest current limit of current limit 4. However, if N disabled consecutive clock pulses 355 are counted while state machine 300 is operating in lower medium state 304, state machine 300 transitions back down to low state 302, which has current limit 1.

Continuing with the example depicted in FIG. 3, if state machine 300 is operating in high state 308 with current limit 4, when N disabled consecutive clock pulses 345 are counted, state machine 300 transitions down to upper medium state 306, which has current limit 3. If another N disabled consecutive clock pulses 350 are counted while state machine 300 is operating in upper medium state 306, state machine 300 then transitions back down to low state 302, which has current limit 1. However, if N enabled consecutive clock pulses 355 are counted while state machine 300 is operating in upper medium state 306, state machine 300 transitions back up to high state 308, which has current limit 4.

As shown in the depicted example with the transitions 320 of state machine in which N enabled consecutive clock pulses 325, 330 and 335 are counted, the modulated clock is used to count the N enabled pulses to increase the current limit in accordance with the teachings of the present invention. With the transitions 340 of state machine in which N disabled consecutive clock pulses 345, 350 and 355 are counted, the modulated clock is used to count the N enabled pulses to increase the current limit in accordance with the teachings of the present invention.

FIG. 4A is a graph illustrating a relationship between an example modulation signal with respect to an input voltage of an example power converter in accordance with the teachings of the present invention. In particular, the example shown in FIG. 4A illustrates a relationship between an example modulation signal $SIG_{mod}$ 446 with respect to an input voltage $SIG_{in}$ 434 of an example power converter in accordance with the teachings of the present invention. In the example, modulation signal $SIG_{mod}$ 446 corresponds with modulation signal 246 and input signal $SIG_{in}$ 434 corresponds with input sense 234 of FIG. 2. As shown in the example depicted in FIG. 4A, modulation signal $SIG_{mod}$ 446 is substantially equal to $SIG_{mod(th1)}$ 407 when input sense signal $SIG_{in}$ 434 is equal to a first input threshold $SIG_{in(th1)}$ 411. As shown in the example, modulation signal $SIG_{mod}$ 446 is inversely proportional to input sense signal $SIG_{in}$ 434. For instance, as shown in FIG. 4A, the magnitude of modulation signal $SIG_{mod}$ 446 decreases from $SIG_{in(th1)}$ 407 to $SIG_{in(th2)}$ 409 as input sense signal $SIG_{in}$ 434 increases from a first threshold $SIG_{in(th1)}$ 411 to a second threshold of sense signal $SIG_{in(th2)}$ 413. In one example, for values of input sense signal $SIG_{in}$ 434 between first and second input thresholds $SIG_{in(th1)}$ 411 and $SIG_{in(th2)}$ 413, the value of modulation signal $SIG_{mod}$ 446 may be determined with the following relationships:

$$SIG_{mod} = SIG_{mod(th1)} - M \times [SIG_{in} - SIG_{in(th1)}] \quad (1)$$

where $$M = \frac{SIG_{mod(th1)} - SIG_{mod(th2)}}{SIG_{in(th2)} - SIG_{in(th1)}} \quad (2)$$

and $$SIG_{mod(th2)} = k \times SIG_{mod(th1)} \quad (3)$$

where in one example:

$$k = 0.5 \quad (4)$$

With modulation signal $SIG_{mod}$ 446 generated as discussed above, FIG. 4B is a graph illustrating a relationship between an average clock frequency $F_{clk(mod)}$ 454 of the modulated clock signal output by an example clock generation circuit with respect to an example modulation signal $SIG_{mod}$ 446 in an example power converter in accordance with the teachings of the present invention. As shown in the illustrated example, the average clock frequency $F_{clk(mod)}$ 454 rises from a minimum value $F_{clk(min)}$ 417, when modulation signal $SIG_{mod}$ 446 is equal to $SIG_{mod(th2)}$ 409, to the original frequency of the first clock signal $F_{clk(orig)}$ 415, when modulation signal $SIG_{mod}$ 446 rises to $SIG_{mod(th1)}$ 407.

In one example, the average clock frequency $F_{clk(mod)}$ 454 may be determined according to the following relationship:

$$F_{clk(mod)} = \frac{SIG_{mod}}{SIG_{mod(th1)}} \times F_{clk(orig)} \quad (5)$$

where $SIG_{mod}$ is the magnitude of modulation signal 246 shown in FIG. 2 and $F_{clk(orig)}$ is the frequency of the original clock signal or first clock signal 250 output by the oscillator, such as for example oscillator 138 of FIG. 1 or oscillator 238 of FIG. 2 in accordance with the teachings of the present invention.

Figure 5A:
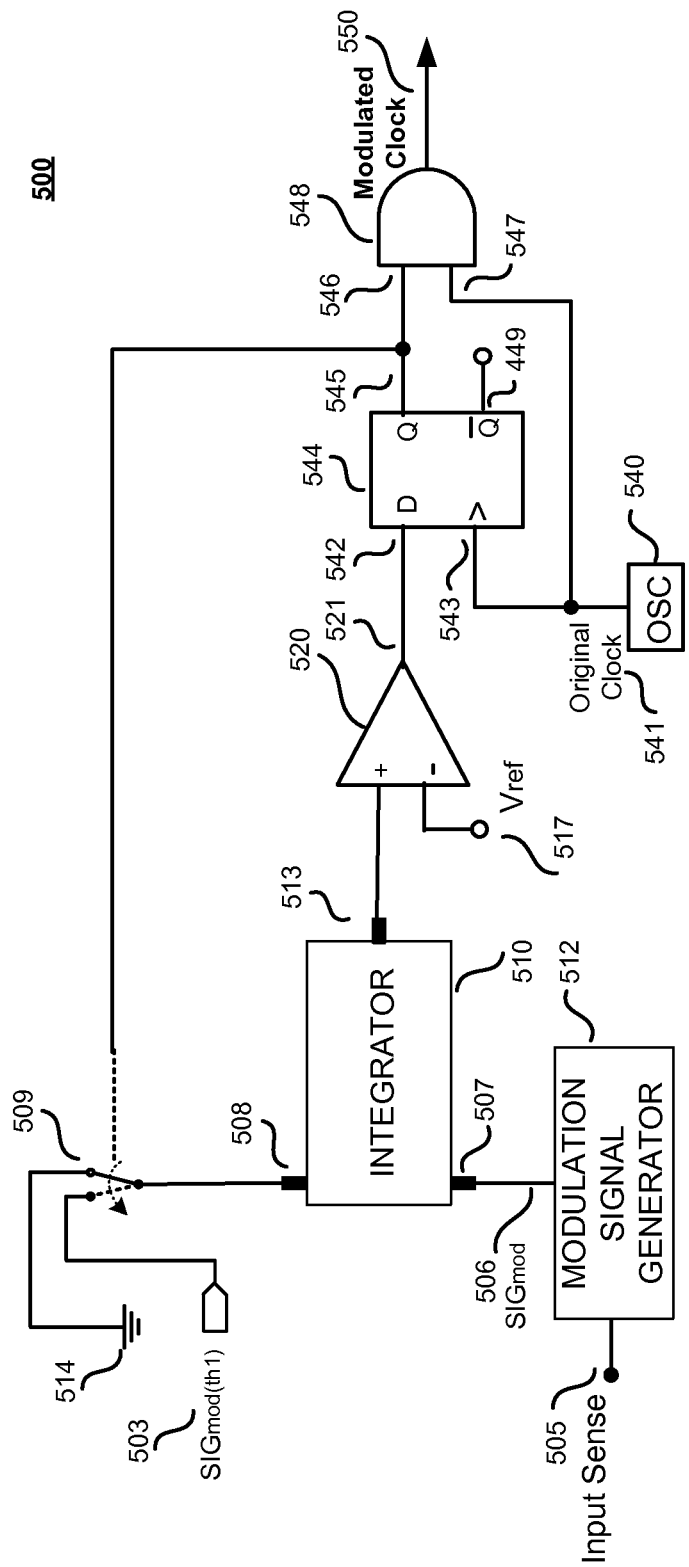
FIG. 5A illustrates a schematic of one example of a clock modulator circuit included in an example clock generation circuit of an example controller in accordance with the teachings of the present invention.

FIG. 5A is a schematic illustrating increased detail of one example of a clock modulator circuit 500 included in an example clock generation circuit of an example controller in accordance with the teachings of the present invention. In one example, clock modulator circuit 500 of FIG. 5 corresponds with clock modulator circuit 248 of FIG. 2. As shown in the depicted example, clock modulator circuit 500 includes an integrator circuit 510 having an input 507, an input 508, and an output 513. In one example, if it is assumed that input 507 is $V_{in1}$ and if it is assumed that input 508 is $V_{in2}$, a transfer function may be defined by the following equation:

$$G \int (V_{in1} - V_{in2}) \quad (6)$$

In the example, G is the gain factor, input 507 is coupled to receive modulation signal $SIG_{mod}$ 506 from modulation signal generator 512 in response to input sense signal 505, and input 508 is coupled to receive the output from a selector circuit 509, which in the illustrated example is either the first threshold of modulation signal $V_{mod(th1)}$ 503, or a reference signal from a ground reference terminal 514. In one example, modulation signal generator 512 and modulation signal SIG$_{mod}$ 506 of FIG. 5A correspond with modulation signal generator 244 and modulation signal 246 of FIG. 2.

Continuing with the example illustrated in FIG. 5A, clock modulator circuit 500 further includes a comparator 520 having a non-inverting input coupled to receive integrator output 513 from integrator circuit 510 and an inverting input coupled to receive reference signal V$_{ref}$ 517. A latch 544, which in one example is a D flip-flop, has an input 542 coupled to an output 521 from comparator 520. Latch 544 also includes a clock input 543 coupled to receive first clock signal 541 from an oscillator 540. As shown in the depicted example, first clock signal 541 may also be referred to as original clock signal. In one example, oscillator 540 and first clock signal 541 of FIG. 5A correspond with oscillator 238 and first clock signal 250 of FIG. 2.

Continuing with the example illustrated in FIG. 5A, an AND gate 548 has an input 546 coupled to the Q output 545 of latch 544. AND gate 548 also includes an input 547 coupled to receive first clock signal 541 from oscillator 540. In the example, the modulated clock signal, which is also referred to in this disclosure as second clock signal 550, is output from AND gate 548 in accordance with the teachings of the present invention.

As shown in the depicted example, the selector circuit 405 is also coupled to the Q output 545 of latch 544. In one example, the Q output 545 of latch 544 is high in response to the integrator output 513 of integrator circuit 510 being greater than V$_{ref}$ 517, as indicated by the output 521 of comparator 520, and with a delay until a next rising edge of first clock signal 541 clocked through latch 544. Similarly, the Q output 545 of latch 544 is low in response to the integrator output 513 of integrator circuit 510 being less than V$_{ref}$ 517, as indicated by the output 521 of comparator 520, and with a delay until a next rising edge of first clock signal 541 clocked through latch 544.

In one example, selector circuit 509 is coupled to select ground reference terminal 514 in response to the Q output 545 of latch 544 being low, and selector circuit 509 is coupled to select first threshold of modulation signal SIG$_{mod(th1)}$ 503 in response to the Q output 545 of latch 544 being high. Therefore, in the example, input 508 of integrator 510 is coupled to ground reference terminal 514 in response to the integrator output signal 513 being less than reference signal V$_{ref}$ 517, or in the alternative, input 508 of integrator 510 is coupled to receive first threshold of modulation signal V$_{mod(th1)}$ 503 in response to the integrator output signal 513 being greater than reference signal V$_{ref}$ 517.

As such, and as will be described in further detail below, integrator circuit 510 is coupled to generate an integrator output signal 513 having a slope substantially proportional to modulation signal SIG$_{mod}$ 506 in response to the integrator output signal 513 being less than reference signal V$_{ref}$ 517 in accordance with the teachings of the present invention. Similarly integrator output signal 513 has a slope substantially proportional to a difference between modulation signal SIG$_{mod}$ 506 and first threshold of modulation signal SIG$_{mod(th1)}$ 503 in response to the integrator output signal 513 being greater than the reference signal V$_{ref}$ 517.

In one example, when the Q output 545 of latch 544 is a logical high value, AND gate 548 is enabled to generate clock pulses of second clock signal 550 that are equal to, or correspond with, clock pulses of first clock signal 541 received from oscillator 540. However, when the Q output 545 of latch 544 is a logical low value, AND gate 548 is disabled from generating clock pulses of second clock signal 550 corresponding with clock pulses of first clock signal 541 received from oscillator 540. Therefore, in operation, clock modulator circuit 500 is coupled to generate second clock signal 550 being substantially equal to first clock signal 541 at a next clock pulse of first clock signal 541 in response to the integrator output signal 513 being greater than the reference signal V$_{ref}$ 517, which causes the Q output 545 of latch 544 being high at the rising edge of next clock cycle of first clock signal 541. Similarly, clock modulator circuit 500 is coupled to disable a next clock pulse of second clock signal 550 in response to the integrator output signal being less than the reference signal, which causes the Q output 545 of latch 544 being low at the next clock cycle of first clock signal 541.

As can be appreciated, as clock pulses in second clock signal 550 are disabled, the average switching frequency F$_{clk(mod)}$ of second clock signal 550 is reduced compared to the original switching frequency F$_{clk(orig)}$ of first clock signal 541 in accordance with the teachings of the present invention. Furthermore, since second clock signal 550 is used for example to generate drive signal 128 to switch power switch S1 110 in FIG. 1, less excess power is transferred to load 118 coupled to the output of power converter 100 as a consequence of high input voltage (i.e., a higher SIG$_{in}$ 102) in accordance with the teachings of the present invention. As input voltage presented by SIG$_{in}$ 102 further increases, the average switching frequency F$_{clk(mod)}$ of second clock signal 550 is further reduced as more cycles in second clock signal 550 are disabled, which further limits excess power from being transferred to load 118 coupled to the output of power converter 100 in accordance with the teachings of the present invention.

Figure 5B:
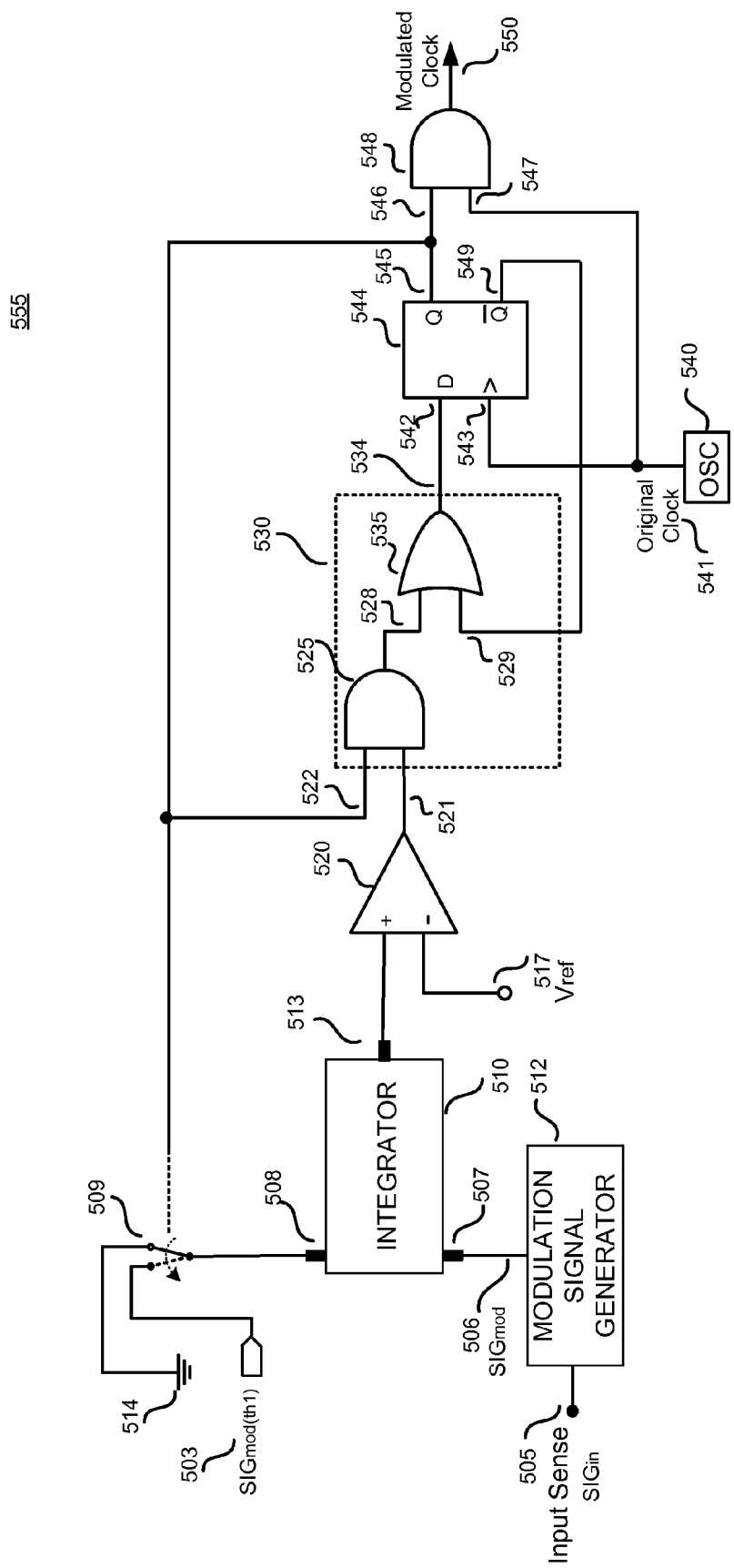
FIG. 5B illustrates a schematic of another example of a clock modulator circuit having example single skip logic included in an example clock generation circuit of an example controller in accordance with the teachings of the present invention.

FIG. 5B illustrates a schematic of another example of a clock modulator circuit 550 in accordance with the teachings of the present invention. As can be observed, it is appreciated that clock modulator circuit 550 of FIG. 5B shares many similarities with clock modulator circuit 500 of FIG. 5A. In particular, the clock modulator circuits 500 of FIGS. 5A and 5B both include a modulation signal generator 512, an integrator circuit 510, a comparator 520, a latch 544, an oscillator 540 and an AND gate 548 as shown. However, one difference is that clock modulator circuit 550 of FIG. 5B also includes single skip logic 530.

In particular, as shown in the example depicted in FIG. 5B, comparator 520 includes a non-inverting input coupled to receive integrator output signal 513, and an inverting input coupled to receive reference signal V$_{ref}$ 517, which in one example can be from ground. Single skip logic 530 in one example may include a first AND gate 525 having a first input coupled to receive an output signal 521 of comparator 520. The example single skip logic 530 illustrated in FIG. 5B also includes an OR gate 535 having an input 528 coupled to an output of first AND gate 525, and an input 529 coupled to the inverted output Qbar 549 of a latch circuit 544. The latch 544, which in the illustrated example is a D flip-flop, includes a clock input 543 coupled to receive first clock signal 541, and an input 542 coupled to an output 534 of OR gate 535. As shown in the example, the Q output 545 of latch 544 is coupled to be received by an input 522 of first AND gate 525 of the single skip logic 530, and the Qbar output 549 of latch 544 as mentioned is received by an input 529 of OR gate 535 of single skip logic 530. In addition, as shown in the example, the second output AND gate 548 is coupled to output second clock signal 550 in response to first clock signal 541 and the Q output 545 of latch 544.

In operation, when the output of comparator 520 goes high, the output of first AND gate 525 can only go high if the Q output 545 of latch 544 is also high. As the output of first AND gate 525 is an input 528 to OR gate 535, output 534 of OR gate 535, which is coupled to input 542 of latch 544, can only go high as a result of Q output 545 of latch 544 being high and the output of comparator 520 being high, or the Qbar output 549 of latch 544 being high. Meanwhile, as the Q output 545 of latch 544 is high, the Qbar output 549 of latch 544 that is coupled to input 529 of OR gate 535 is low. However, when the output of comparator 520 goes low, which happens when the output 513 of integrator circuit 510 is less than reference signal $V_{ref}$ 517, the output of first AND gate 525 remains low regardless of Q output 545 of latch 544. As the output of first AND gate 525 is an input 528 to OR gate 535, the output of OR gate 535, which is coupled to the input 542 of latch 544, only goes to logic high if the Q output 545 of latch 544 is low and the Qbar output 549 is high.

In operation, single skip logic 530 prevents second clock signal 550 from having consecutive disabled clock cycles as a result of output Q 545 of latch 544 being low for consecutive cycles. That is, single skip logic 530 prevents input 542 of latch 544 from being low for consecutive clock cycles of first clock signal 541. By preventing the grouping of consecutive cycles of second clock signal 550 from being disabled, the average switching frequency $F_{clk(mod)}$ of second clock signal 550 is prevented from dropping to frequencies less than 50% of the switching frequency $F_{clk(orig)}$ of first clock signal 541. In one example, the minimum frequency of $F_{clk(mod)}$ of second clock signal 550, which is used to generate the drive signal to switch the power switch of the power converter, is therefore maintained to remain at a frequency that is greater than any audible noise that can be perceived by a human ear in accordance with the teachings of the present invention. In one example, preventing the grouping of consecutive cycles of second clock signal 550 from being disabled also improves the output ripple and transient response of the power converter.

Figure 6A:
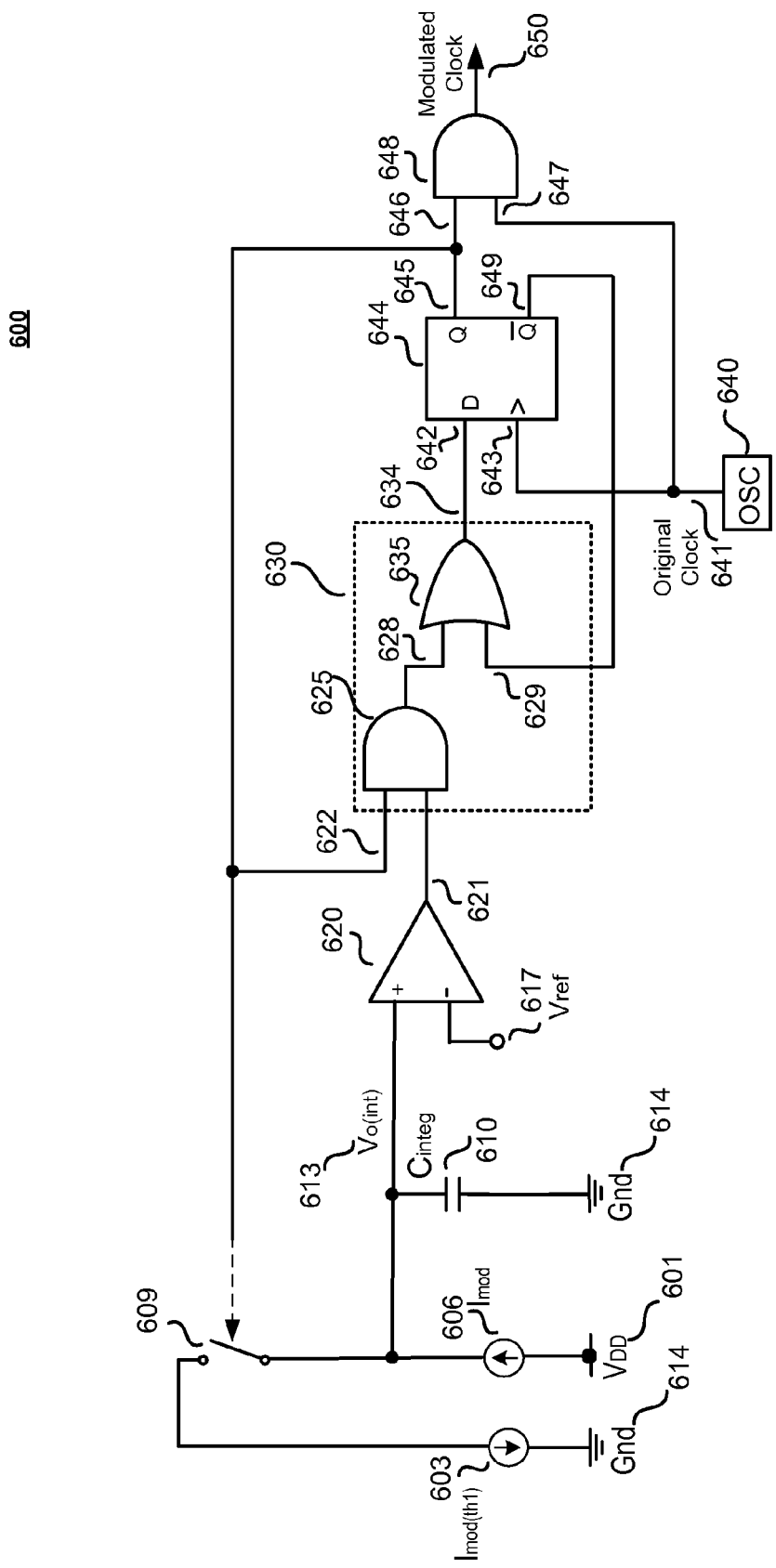
FIG. 6A illustrates a schematic of an example of a clock modulator circuit including current sources in accordance with the teachings of the present invention.

FIG. 6A illustrates an example functional block diagram of a clock generator implementation utilizing the current sources in accordance with the teachings of the present invention. It is appreciated that the logic blocks included in FIG. 6A are similar to those included in FIG. 5B with similar functionality. However the first stage in FIG. 5B representing the integrator 510, modulation signal generator 512, modulation signal $SIG_{(mod)}$ 506 and the first threshold of modulation signal 503 are realized in the example depicted in FIG. 6A with current sources $I_{mod}$ 606, $I_{mod(th1)}$ 603, and a simple capacitance $C_{integ}$ 610 as the integrator in accordance with the teachings of the present invention.

As shown in the depicted example, the non-inverting input of comparator 620 receives an integrator output signal 613 that is the voltage $V_{o(int)}$ across the integrating capacitance $C_{integ}$ 610. The inverting input of comparator 620 receives reference signal $V_{ref}$ 617. The input to integrating capacitance $C_{integ}$ 610 is the charging and discharging currents with current source $I_{mod}$ 606 defining the charging slope while selector switcher 609 is open and the difference between current source 606 and current source 603, or $I_{mod}-I_{mod(th1)}$, defining the discharging slope of integrating capacitance $C_{integ}$ 610 when selector switcher 609 is closed.

Single skip logic 630 in one example may include a first AND gate 625, which is coupled to receive at a first input the output signal 621 of comparator 620. The example single skip logic 630 also includes an OR gate 635 with an input 628 that is coupled to an output of first AND gate 625, and an input 629 coupled to the inverted output Qbar 649 of a latch circuit 644. The latch 644, a D flip-flop, includes a clock input 643 coupled to receive first clock signal (original clock) 641, and an input 642 coupled to an output 634 of OR gate 635. As shown in the example diagram, the Q output 645 of latch 644 is coupled to be received by an input 622 of first AND gate 625 of the single skip logic 630, and the Qbar output 649 of latch 644 is received by an input 629 of OR gate 635 of single skip logic 630. In addition, as shown in the example, second AND gate 648 is coupled to output second clock signal 650 in response to first clock signal 641 and the Q output 645 of latch 644.

When the output of comparator 620 goes high, the output of first AND gate 625 can only go high if the Q output 645 of latch 644 is also high. As the output of first AND gate 625 is an input 628 to OR gate 635, output 634 of OR gate 635, which is coupled to input 642 of latch 644, can only go high as a result of Q output 645 of latch 644 being high and the output of comparator 620 being high or, the Qbar output 649 of latch 644 being high. Meanwhile, as the Q output 645 of latch 644 is high, the Qbar output 649 of latch 644 that is coupled to input 629 of OR gate 635 is low and when the output of comparator 620 goes low, which happens when the output 613 of integrator capacitance 610 is less than reference signal $V_{ref}$ 617, the output of first AND gate 625 remains low regardless of Q output 645 of latch 644. As the output of first AND gate 625 is an input 628 to OR gate 635, the output of OR gate 635, which is coupled to the input 642 of latch 644, only goes to logic high if the Q output 645 of latch 644 is low and the Qbar output 649 is high.

The single skip logic 630, which is the same as the single skip logic 530 of FIG. 5B, prevents second clock signal 650 from having consecutive disabled clock cycles as a result of output Q 645 of latch 644 being low for consecutive cycles. In other words, single skip logic 630 prevents input 642 of latch 644 from being low for consecutive clock cycles of first clock signal 641. By preventing the grouping of consecutive cycles of second clock signal 650 from being disabled, the average switching frequency $F_{clk(mod)}$ of second clock signal 650 is prevented from dropping to frequencies less than 50% of the switching frequency $F_{clk(orig)}$ of first clock signal 641, thereby maintaining the second clock signal 650 at a frequency that is greater than any audible noise in accordance with the teachings of the present invention. In one example, preventing the grouping of consecutive cycles of second clock signal 550 from being disabled also improves the output ripple and transient response of the power converter.

Figure 6B:
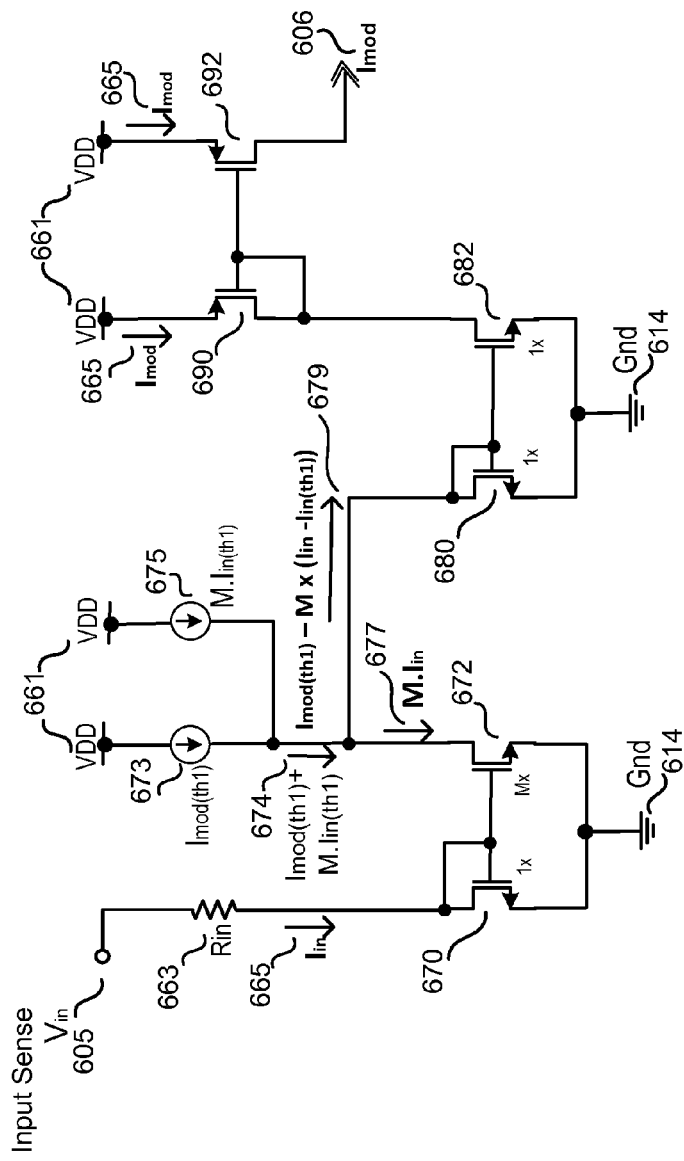
FIG. 6B illustrates a schematic of an example modulation signal generator including current sources in accordance with the teachings of the present invention.

FIG. 6B illustrates an example implementation of a modulation signal generator 650 utilizing the current sources in accordance with the teachings of the present invention. As shown in the depicted example, a current signal 665, which is representative of input sense signal $SIG_{in}$ 505 in FIG. 5B, from the input terminal 605 of the input voltage $V_{in}$ through a resistor $R_{in}$ 663. Current signal $I_{in}$ 665 passes through diode connected N-MOSFET 670 and is mirrored on N-MOSFET 672 with a scaled factor of M. Thus, the current through N-MOSFET 672 is equal to $M \times I_{in}$ 677. The source terminals of N-MOSFET 670 and N-MOSFET 672 are coupled to ground 614.

As shown in the depicted example, current sources 673 and 675 are generated through the supply voltage 661 and are combined to provide a total current 674, which is equal to $I_{mod(th1)}+M \times I_{in(th1)}$. In the example, current source 673 presents current signal $I_{mod(th1)}$, which represents a first threshold of the modulation signal and current source 675 presents current signal $M \times I_{in(th1)}$, which represents a first threshold of the input sense signal scaled by factor M. By subtracting the current $M \times I_{in}$ 677 through N-MOSFET 672 from current 674, the resulting current 679, $I_{mod(th1)}-M \times (I_{in}-I_{in(th1)})$ is passed through the diode connected N-MOSFET 680 and mirrored through N-MOSFET 682, with source terminals coupled to ground 614.

As shown in the depicted example, P-MOSFET 690 is diode connected from supply VDD 661 and is coupled in series with N-MOSFET 682 to conduct current 665, $I_{mod}=I_{mod(th1)}-M\times(I_{in}-I_{in(th1)})$, which is mirrored through P-MOSFET 692 coupled to supply VDD 661, and conducts the mirrored current $I_{mod}$ to the output terminal 606 of the modulation signal generator 650.

In FIG. 6B the current signals $I_{mod}$, $I_{mod(th1)}$, and $I_{in(th1)}$ are respectively analogous to modulation signal $SIG_{mod}$, first threshold of modulation signal $SIG_{mod(th1)}$ and the first threshold of input signal $SIG_{in(th1)}$ in FIG. 5A and FIG. 5B.

Figure 7A:
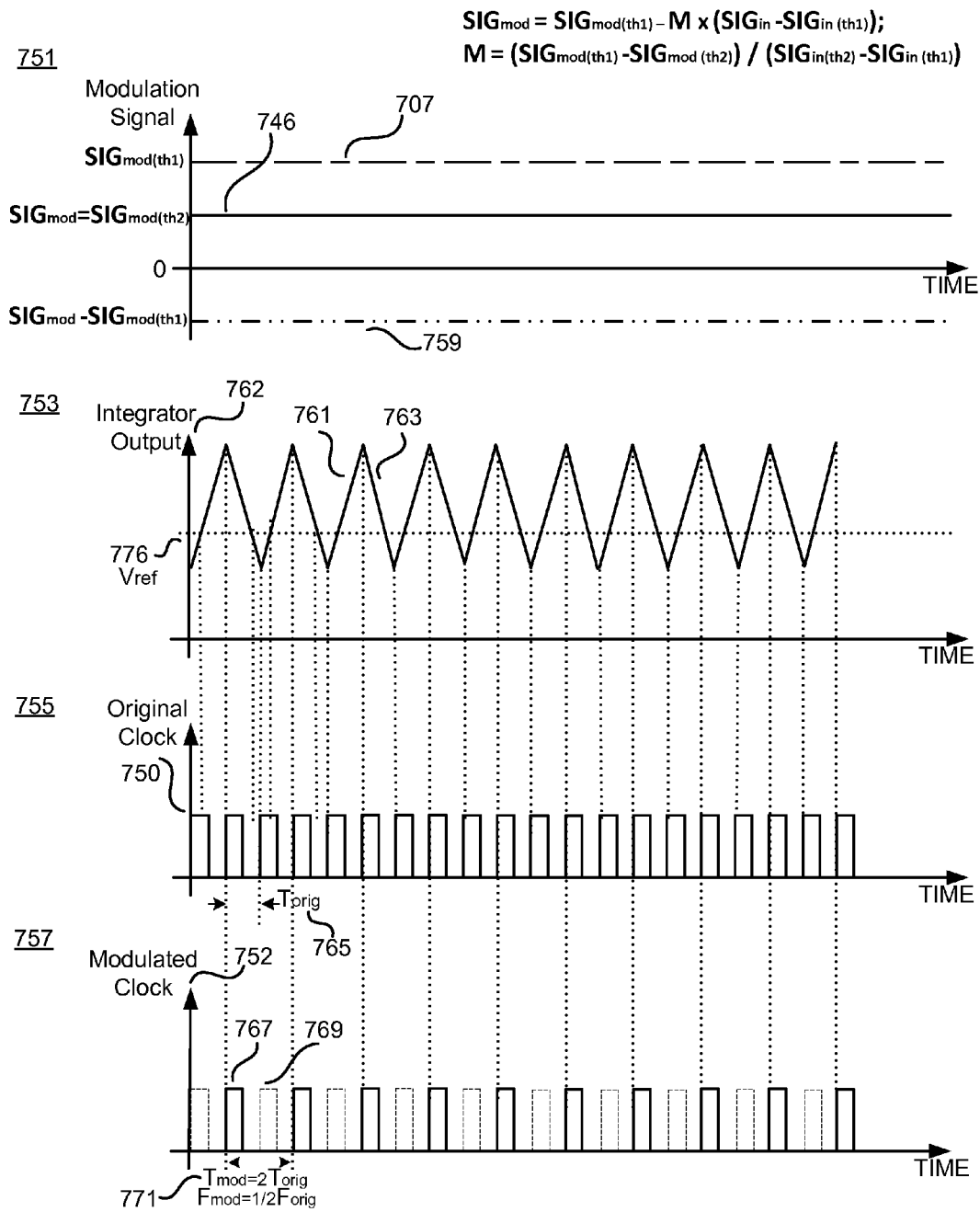
FIG. 7A illustrate graphs that show relationships between example waveforms found in an example clock modulator with respect to time with input voltage equal to a second input threshold voltage in accordance with the teachings of the present invention.
Figure 7B:
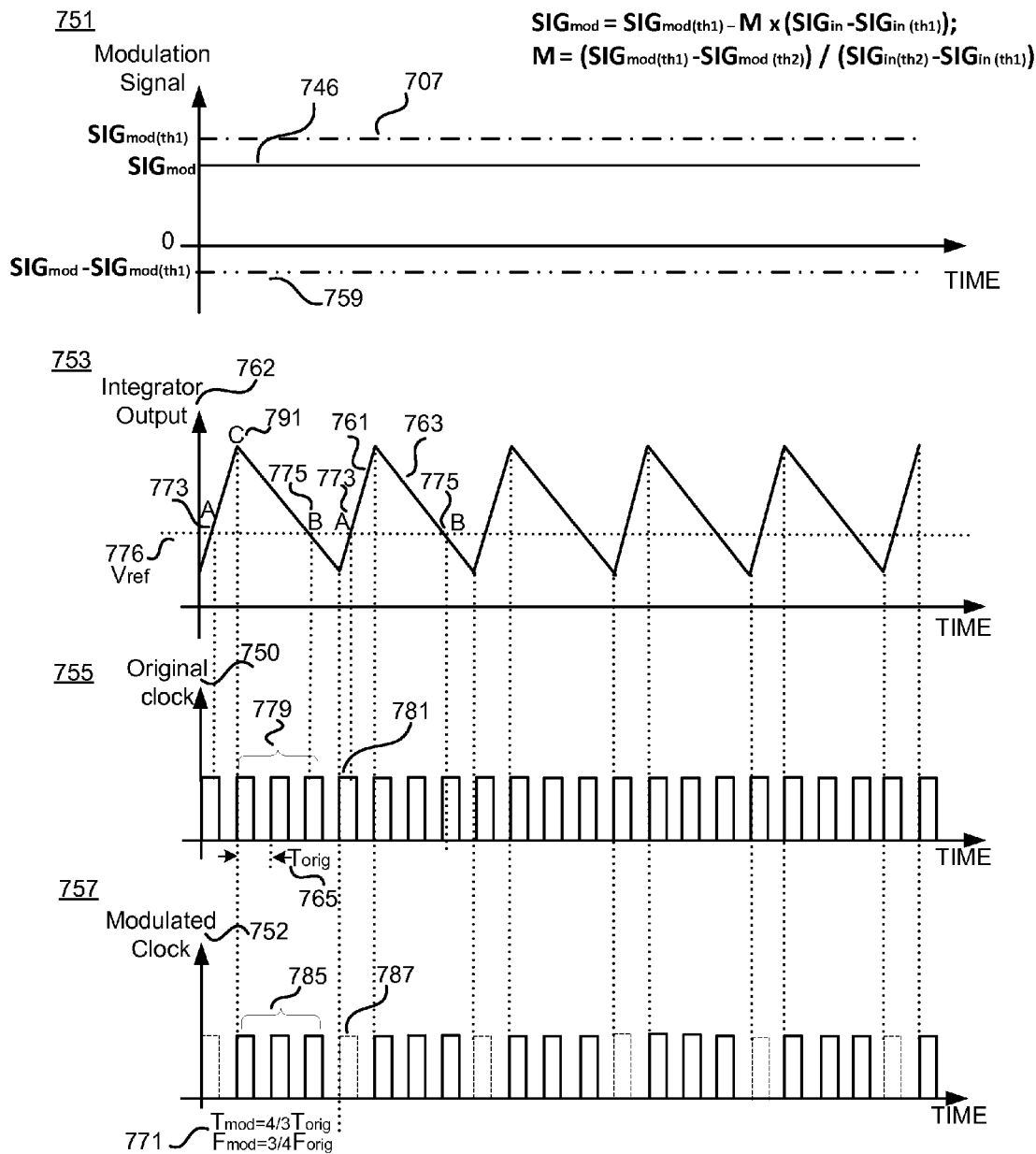
FIG. 7B illustrate graphs that show relationships between example waveforms found in an example clock modulator with respect to time with input voltage between first and second input threshold voltages in accordance with the teachings of the present invention.
Figure 7C:
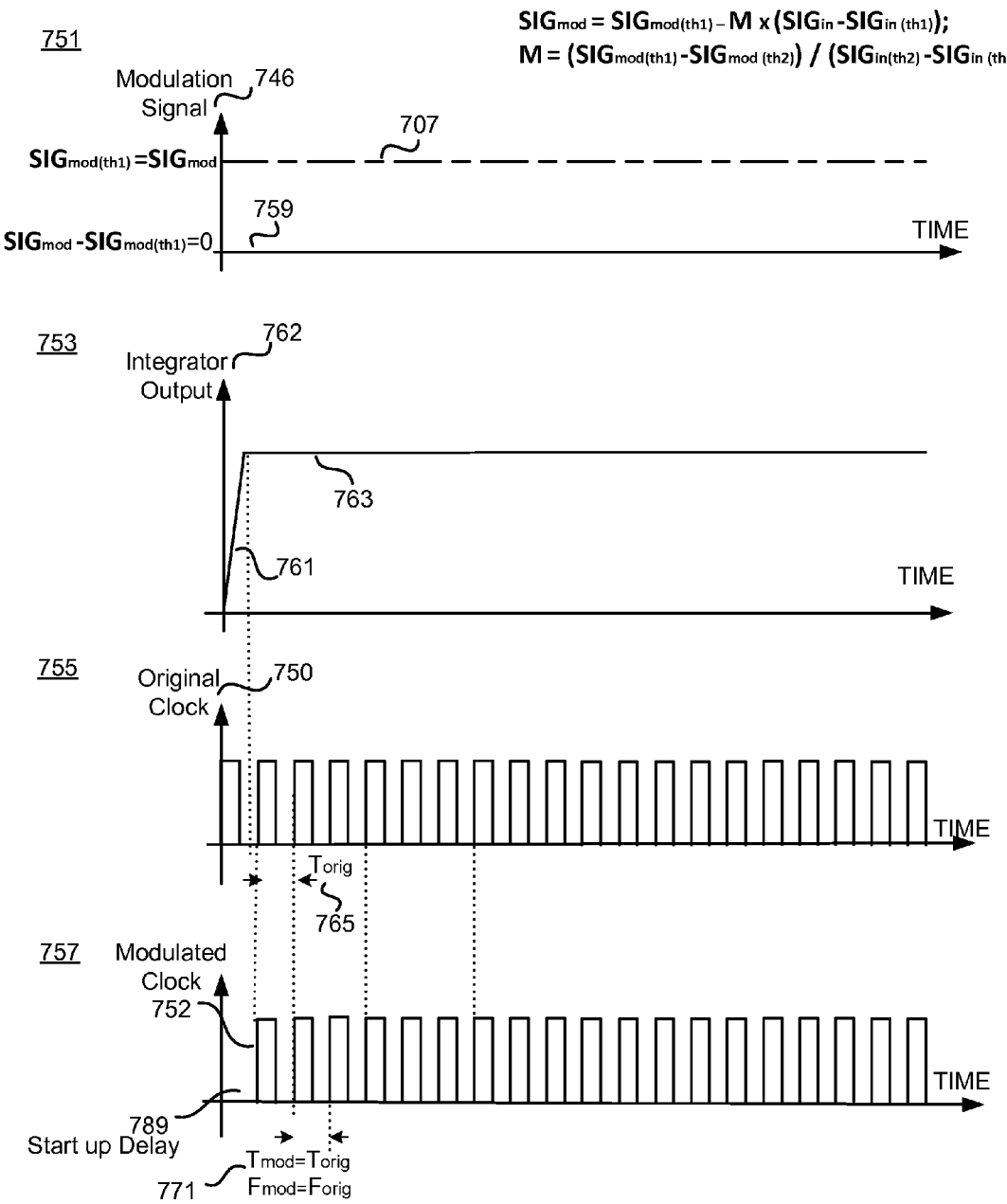
FIG. 7C illustrate graphs that show relationships between example waveforms found in an example clock modulator with respect to time with input voltage less than or equal to a first input threshold voltage in accordance with the teachings of the present invention.

FIGS. 7A, 7B and 7C illustrate graphs that show relationships between example waveforms found in an example clock modulator with respect to time in accordance with the teachings of the present invention.

In particular, FIG. 7A illustrates an example in which the input sense signal $SIG_{in}=SIG_{in(th2)}$. In one example, an input sense signal representing that the input voltage is at second threshold indicates a maximum input voltage, which in one example indicates $V_{in(th2)}=V_{in(max)}=1000$ V. Therefore, as discussed above with respect to FIG. 4A, when $SIG_{in}=SIG_{in(th2)}$, $SIG_{mod}=SIG_{mod(th2)}$. In one example, $SIG_{mod(th2)}=0.5V_{mod(th1)}$. In FIG. 7A, graph 751 illustrates modulation signal $SIG_{mod}$ 746, which is inversely proportional to the input signal $SIG_{in}$, with respect to time. Graph 751 also shows $SIG_{mod(th1)}$ 707 as well as $SIG_{mod}-SIG_{mod(th1)}$ 759 with respect to time.

Continuing with the example illustrated in FIG. 7A, graph 753 illustrates the rising slope 761 and falling slope 763 signals of integrator output 762, which corresponds to the output 513 of integrator circuit 510 in FIGS. 5A-5B. Accordingly, as shown in graph 753 of FIG. 7A, the rising slope 761 of integrator output 762 is proportional to $SIG_{mod}$, which is equal to $SIG_{mod(th2)}$ in FIG. 7A. Similarly, the falling slope 763 of integrator output 762 is proportional to $SIG_{mod}-SIG_{mod(th1)}$. In graph 753, integrator output 762 is compared to reference voltage $V_{ref}$ 776, which in one example is equal to ground or zero volts. This corresponds to the integrator output 513 and $V_{ref}$ 517 inputs to comparator 520 in FIGS. 5A-5B.

In one example, based on an adjusted gain of modulation signal generator 512 (FIGS. 5A-5B), the gain of integrator circuit 510, and due to the rising edge delays of latch 544, every time that the sloped ramp of integrator output 513 reaches the reference voltage $V_{ref}$ 517 and the output 521 of comparator 520 rises to a logic high or falls to a logic low at the input 542 of latch 544, as shown in FIG. 7A, every other clock pulse of original clock 750 shown in graph 755 (e.g., first clock signal 541 in FIGS. 5A-5B) is disabled, as illustrated in modulated clock signal 752 shown in graph 757 (e.g., second clock signal 550 in FIGS. 5A-5B).

In particular, as shown in graphs 753, 755 and 757, the clock pulses 767 of second clock signal 752 are enabled, or are substantially equal to clock pulses of first clock signal 750 at next clock pulses of first clock signal 750 after the integrator output signal 762 rises to be greater than the reference voltage $V_{ref}$ 776. Similarly, as shown in graphs 753, 755 and 757, the clock pulses 769 are disabled in second clock signal 752 at a next clock pulse of second clock signal 752 after the integrator output signal 762 falls to be less than the reference voltage $V_{ref}$ 776. Indeed, as shown in graph 757, clock pulses 767 are enabled in second clock signal 752, but clock pulses 769 are disabled. As a result, the period $T_{mod}$ 771 of second clock signal 752 is equal to twice the period $T_{orig}$ 765 of first clock signal 750 resulting in the frequency $F_{clk(mod)}$ of second clock signal 752 being half the frequency $F_{orig}$ of first clock signal 750 in accordance with the teachings of the present invention.

FIG. 7B illustrates graphs that show additional relationships between example waveforms found in an example clock modulator with respect to time in accordance with the teachings of the present invention. In particular, FIG. 7B illustrates an example in which the input signal $SIG_{in}$ is between a first input threshold $SIG_{in(th1)}$ and a second input threshold signal $SIG_{in(th2)}$, which in one example represent a minimum and a maximum of expected input voltage, respectively. In other words, $SIG_{in(th1)}<SIG_{in}<SIG_{in(th2)}$ in FIG. 7B. In one example, the minimum and maximum of expected input voltages (e.g., the DC bus/rail voltage) could be 200 V and 1000V, such that $200V<V_{in}<1000V$. As discussed above with respect to FIG. 4A, when $SIG_{in(th1)}<SIG_{in}<SIG_{in(th2)}$, $SIG_{mod(th2)}<SIG_{mod}<SIG_{mod(th1)}$. In FIG. 7B, graph 751 illustrates modulation signal $SIG_{mod}$ 746, which is inversely proportional to the input signal $SIG_{in}$, with respect to time. Graph 751 also shows $SIG_{mod(th1)}$ 707 as well as $SIG_{mod}-SIG_{mod(th1)}$ 759 with respect to time.

Continuing with the example illustrated in FIG. 7B, as illustrated in graph 751, the $SIG_{mod}$ 746 value is higher than the absolute value of $|SIG_{mod}-SIG_{mod(th1)}|$. As shown in graph 753, the rising slope 761 of the integrator output 762 ramp, which is proportional to $SIG_{mod}$, is greater in magnitude than the magnitude of the falling slope 763 of the integrator output 762 ramp, which is proportional to $SIG_{mod}-SIG_{mod(th1)}$. As a result, there is a longer amount of time that the Q output 545 of latch 544 (FIGS. 5A-5B) is at a logic high and a shorter amount of time that the Q output 545 of latch 544 is at a logic low. This has the effect of one disabled clock pulse 787 in second clock signal 752 for a plurality of enabled clock pulses 785 in second clock signal 752, as shown in graph 757.

To illustrate with reference to graph 753, at point A 773 when integrator output 762 rises to be greater than reference voltage $V_{ref}$ 776, referring to FIGS. 5A-5B, the input 542 of latch 544 goes high causing Q output 545 to be high at a next clock pulse 757, at which point C 791 selector circuit 509 (FIG. 5A-5B) selects the first threshold of modulation signal $SIG_{mod(th1)}$ 503, and the slope of integrator output 762 therefore changes from a rising slope 761 to a falling slope 763 proportional to $SIG_{mod}-SIG_{mod(th1)}$, while enabling clock pulses 779. When again at point B 775 the integrator output 762 falls to be less than reference voltage $V_{ref}$ 776, referring FIGS. 5A-5B the input 542 of latch 544 goes low, which causes Q output 545 to be low at a next clock pulse, disabling clock pulse 781, at which point selector circuit 509 selects the ground reference 514 and the slope of integrator output 762 changes back to a rising slope proportional to $SIG_{mod}$.

Graph 757 shows second clock signal 752 with enabled clock pulses 785 when in FIGS. 5A-5B the Q output 545 of latch 544 is logic high and the single disabled clock pulse 787 when Q output 545 of latch 544 is logic low. As an example, if for each three enabled clock pulses 785 there is one disabled clock pulse 787, then the modulated clock average period $T_{mod}$ 771 is equal to 4/3 of the period $T_{orig}$ 765 of first clock signal, original clock 750, resulting in an average frequency $F_{mod}$ of second clock signal, modulated clock 752, to be equal to ¾ of the frequency $F_{orig}$ of first clock signal 750 in accordance with the teachings of the present invention.

FIG. 7C illustrates graphs that show even more relationships between example waveforms found in an example clock modulator with respect to time in accordance with the teachings of the present invention. In particular, FIG. 7C illustrates an example in which the input signal which represents input voltage $V_{in}$, is less than or equal to a first threshold, or $SIG_{in} \leq SIG_{in(th1)}$. $SIG_{in(th1)}$ may represent minimum input voltage, which in one example could be $V_{in(min)}=200$ V. As depicted in graph 751, line 707 represents $SIG_{mod}=$ $SIG_{mod(th1)}$ since $SIG_{In} \leq SIG_{in(th1)}$ ($V_{in} \leq V_{in(th)}$), as further discussed above in FIG. 4A. It is also noted that in graph 751, line 759 representing $SIGmod - SIG_{mod(th1)}$ is equal to zero since $SIG_{mod} = SIG_{mod(th1)}$.

In this condition, the integrator output 762 of integrator circuit 510 (FIG. 5A-5B) after ramping up at startup, as indicated with rising slope 761, remains at a fixed high positive level, since the "falling" slope 763 is actually equal to zero and therefore doesn't fall because $SIG_{mod} - SIG_{mod(th1)}$ is equal to zero since $SIG_{mod} = SIG_{mod(th1)}$. Due to the logic high at the input 542 of latch 544, the Q output 545 of latch 544, referring to FIGS. 5A-5B, after a delay 789 until the first rising edge of the first clock signal 750 pulse latches the Q output 545 of latch 544 at a logic high and remains at logic high while input signal $SIG_{in}$ is less than or equal to a first threshold, which indicates that the input voltage is less than or equal to a minimum threshold. All of the clock pulses of first clock signal 750 (e.g., original clock) are enabled in second clock signal 752 (e.g., modulated clock) by AND gate 548, referring to FIGS. 5A-5B. As shown, at a low line voltage for input signal $SIG_{in}$ that is less than the $SIG_{in(th1)}$, there is no modulation of first clock signal 750 and all clock pulses are therefore enabled in second clock signal 752. Thus, the period $T_{mod}$ 771 of second clock signal 752 is the same as the period $T_{orig}$ 765 of first clock signal 750, and the frequency $F_{mod}$ of second clock signal 752 is the same as the frequency $F_{orig}$ of first clock signal 750 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A clock generation circuit for use in a power converter controller, comprising:
    a modulation signal generator coupled to generate a modulation signal in response to an input sense signal representative of an input voltage of a power converter, wherein the modulation signal is responsive to the input sense signal when the input sense signal is greater than a first input threshold; and
    a clock modulator circuit coupled to receive the modulation signal and a first clock signal from an oscillator, the clock modulator circuit coupled to generate a second clock signal in response to the first clock signal and the modulation signal, wherein an average frequency of the second clock signal is responsive to the modulation signal.

2. The clock generation circuit of claim 1 wherein the modulation signal is inversely proportional to the input sense signal.

3. The clock generation circuit of claim 1 wherein an average frequency of the second clock signal is proportional to the modulation signal when the modulation signal is less than a first threshold of modulation signal.

4. The clock generation circuit of claim 1 wherein the frequency of the second clock signal is equal to the frequency of the first clock signal when the modulation signal is greater than or equal to a first threshold of modulation signal.

5. The clock generation circuit of claim 1 wherein the modulation signal is equal to a minimum modulation signal value if the input sense signal is equal to a second input threshold.

6. The clock generation circuit of claim 1 wherein the modulation signal is equal to a first threshold of modulation signal value if the input sense signal is equal to the first input threshold.

7. The clock generation circuit of claim 6 wherein the modulation signal generator comprises:
    a first current minor having a first input coupled to receive the input sense signal, the first current mirror having a second input coupled to receive a first current from a first current source and receive a second current from a second current source, wherein the first current is representative of the first threshold of modulation signal and the second current is representative of the first input threshold; and
    a second current minor having a first input coupled to the first current minor to receive the first current and the second current minus a mirrored representation of the input sense signal, wherein the second current minor has an output coupled to generate the modulation signal.

8. The clock generation circuit of claim 1 wherein the clock modulator circuit includes an integrator circuit coupled to be charged in response to the modulation signal and wherein the integrator circuit is coupled to be discharged in response to the modulation signal minus a first threshold of modulation signal, wherein the integrator circuit is coupled to generate an integrator output signal having a slope substantially proportional to the modulation signal in response to the integrator output signal being less than a reference signal, wherein the integrator output signal has a slope substantially proportional to a difference between the modulation signal and a first threshold of modulation signal in response to the integrator output signal being greater than the reference signal.

9. The clock generation circuit of claim 8 wherein the reference signal is substantially equal to a ground reference voltage.

10. The clock generation circuit of claim 8 wherein the reference signal is different than a ground reference voltage.

11. The clock generation circuit of claim 8 wherein the clock modulator circuit is coupled to generate the second clock signal to be substantially equal to the first clock signal at a next clock pulse of the first clock signal in response to the integrator output signal being greater than the reference signal, wherein the clock modulator circuit is coupled to disable a next clock pulse of the second clock signal in response to the integrator output signal being less than the reference signal.

12. The clock generation circuit of claim 8 wherein the integrator output signal is coupled to have the slope substantially proportional to the modulation signal beginning at a next clock pulse of the first clock signal in response to the integrator output signal being less than the reference signal, wherein the integrator output signal is coupled to have the slope proportional to the difference between the modulation signal and the first threshold of modulation signal beginning at the next clock pulse of the first clock signal in response to the integrator output signal being greater than the reference signal.

13. The clock generation circuit of claim 8 wherein clock modulator further includes:
    a comparator having inputs coupled to receive the integrator output signal and the reference signal;

a latch coupled to receive the first clock signal and an output signal of the comparator; and a first AND gate coupled to output the second clock signal in response to the first clock signal and a first output signal of the latch.

14. The clock generation circuit of claim 8 wherein the clock modulator further includes:

a comparator having inputs coupled to receive the integrator output signal and the reference signal;

single skip logic including a second AND gate having a first input coupled to receive an output signal of the comparator, the single skip logic further including an OR gate having a first input coupled to an output of the second AND gate;

a latch coupled to receive the first clock signal and an output signal of the OR gate, wherein a first output of the latch is coupled to be received by a second input of the second AND gate, and wherein a second output of the latch is coupled to be received by a second input of the OR gate; and a first AND gate coupled to output the second clock signal in response to the first clock signal and the first output of the latch.

15. A power converter, comprising:

an energy transfer element having first and second windings coupled between an input of the power converter and an output of the power converter;

a power switch coupled to the first winding of the energy transfer element; and a controller coupled to control switching of the power switch to control a transfer of energy from the input of the power converter to the output of the power converter, the controller comprising:

an on-off control circuit coupled to generate a drive signal coupled to control the power switch, the drive signal coupled to be generated in response to a feedback signal representative of the output of the power converter;

an oscillator coupled to generate a first clock signal;

a modulation signal generator coupled to generate a modulation signal in response to an input sense signal representative of an input voltage of the power converter, wherein the modulation signal is responsive to the input sense signal when the input sense signal is greater than a first input threshold; and a clock modulator circuit coupled to receive the modulation signal and the first clock signal from an oscillator, the clock modulator circuit coupled to generate a second clock signal in response to the first clock signal and the modulation signal, wherein an average frequency of the second clock signal is responsive to the modulation signal, wherein the on-off control circuit is further coupled to generate the drive signal in response to the second clock signal.

16. The power converter of claim 15 wherein the modulation signal is equal to a second threshold of modulation signal value if the input sense signal is equal to a second input threshold.

17. The power converter of claim 15 wherein the modulation signal is equal to a first threshold of modulation signal value if the input sense signal is equal to the first input threshold.

18. The power converter of claim 17 wherein the modulation signal generator comprises:

a first current minor having a first input coupled to receive the input sense signal, the first current mirror having a second input coupled to receive a first current from a first current source and receive a second current from a second current source, wherein the first current is representative of the maximum modulation signal and the second current is representative of the first input threshold; and a second current minor having a first input coupled to the first current minor to receive the first current and the second current minus a mirrored representation of the input sense signal, wherein the second current minor has an output coupled to generate the modulation signal.

19. The power converter of claim 15 wherein the clock modulator circuit includes an integrator circuit coupled to be charged in response to the modulation signal and wherein the integrator circuit is coupled to be discharged in response to the modulation signal minus a first threshold of modulation signal, wherein the integrator circuit is coupled to generate an integrator output signal having a slope substantially proportional to the modulation signal in response to the integrator output signal being less than a reference signal, wherein the integrator output signal has a slope substantially proportional to a difference between the modulation signal and a first threshold of modulation signal in response to the integrator output signal being greater than the reference signal.

20. The power converter of claim 19 wherein the reference signal is substantially equal to a ground reference voltage.

21. The power converter of claim 19 wherein the reference signal is different than a ground reference voltage.

22. The power converter of claim 19 wherein the clock modulator circuit is coupled to generate the second clock signal to be substantially equal to the first clock signal at a next clock pulse of the first clock signal in response to the integrator output signal being greater than the reference signal, wherein the clock modulator circuit is coupled to disable a next clock pulse of the second clock signal in response to the integrator output signal being less than the reference signal.

23. The power converter of claim 19 wherein the integrator output signal is coupled to have the slope substantially proportional to the modulation signal beginning at a next clock pulse of the first clock signal in response to the integrator output signal being less than the reference signal, wherein the integrator output signal is coupled to have the slope proportional to the difference between the modulation signal and the first threshold of modulation signal beginning at the next clock pulse of the first clock signal in response to the integrator output signal being greater than the reference signal.

24. The power converter of claim 15 where the controller further comprises a state machine coupled to the on-off control circuit to adjust a current limit through the power switch, wherein the state machine is coupled to be responsive to the first and second clock signals.

25. The power converter of claim 24 wherein the state machine is coupled to reduce the current limit through the power switch in response to the first clock signal.

26. The power converter of claim 24 wherein the state machine is coupled to increase the current limit through the power switch in response to the second clock signal.

27. The power converter of claim 15 wherein the power switch and the controller are comprised in a monolithic integrated circuit.

* * * * *